US008541263B1

(12) United States Patent  (10) Patent No.: US 8,541,263 B1
Toong et al.  (45) Date of Patent: Sep. 24, 2013

(54) THERMOSET MOLDING FOR ON-PACKAGE DECOUPLING IN FLIP CHIPS

(75) Inventors: Teik Tiong Toong, Siam (MY); Loon Kwang Tan, Lima Kepala Batas (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/197,072

(22) Filed: Aug. 22, 2008

(51) Int. Cl.
 *H01L 21/00* (2006.01)
(52) U.S. Cl.
 USPC ............................................ 438/127; 257/712
(58) Field of Classification Search
 USPC .................................. 438/106, 127; 257/712
 See application file for complete search history.

(56) References Cited

U.S. PATENT DOCUMENTS

| 6,117,513 | A  | * | 9/2000  | Hotta et al. ..................... 428/67 |
| 6,172,424 | B1 | * | 1/2001  | Kinouchi et al. ............. 257/787 |
| 2002/0015292 | A1 | * | 2/2002  | Pritchett et al. ............... 361/780 |
| 2002/0038918 | A1 | * | 4/2002  | Gotou et al. ..................... 264/39 |
| 2004/0053443 | A1 | * | 3/2004  | Kumamoto et al. .......... 438/106 |
| 2004/0229401 | A1 | * | 11/2004 | Bolken et al. ................. 438/109 |
| 2007/0099346 | A1 | * | 5/2007  | Farooq et al. ................. 438/108 |
| 2007/0143993 | A1 | * | 6/2007  | Hsu ................................. 29/832 |

* cited by examiner

*Primary Examiner* — Thao Le
*Assistant Examiner* — Geoffrey Ida
(74) *Attorney, Agent, or Firm* — Womble Carlyle Sandridge & Rice, LLP

(57) ABSTRACT

In an exemplary embodiment, a method takes as an input a package substrate on which multiple capacitors have been mounted in a ring as part of a design to effectuate on-package decoupling. The method involves plasma cleaning the package substrate and the capacitors to remove organic contaminants. The method then involves applying a thermoset plastic to encase the capacitors on the package substrate. In one embodiment, a heated metal mold is utilized and the thermoset plastic is placed therein. The method includes opening the metal mold and curing the molded thermoset plastic by baking the molded thermoset plastic at an elevated temperature.

21 Claims, 6 Drawing Sheets

THERMOSET MOLDING FOR ON-PACKAGE DECOUPLING IN FLIP CHIPS

BACKGROUND

During its operation, a semiconductor device package may experience some degree of simultaneous switching noise (SSN). This may occur when multiple drivers switch simultaneously causing a voltage ripple in the device's power delivery system and offsetting the voltage reference within the semiconductor device package from its specified value. This voltage reference shift is commonly known as SSN and is exacerbated by the increased number of multiple drivers switching simultaneously in today's semiconductor device packages and the large inductance introduced by power and ground leads. As a result, SSN may cause errors in the operation of the chip (e.g., drivers not responding correctly). Therefore, the more SSN present, the less reliable the semiconductor device package will become.

One approach for minimizing SSN is to include decoupling capacitors (also referred to as bypass capacitors) in the package's power delivery system. Conventionally, decoupling capacitors are mounted on the top surface or bottom surface of the package substrate. In such an arrangement, the positive terminal end and negative terminal end of the decoupling capacitor are connected by vias to the power plane and ground plane respectively. Such an arrangement is sometimes referred to as on-package decoupling.

The use of decoupling capacitors limits options to provide structural strength to prevent warpage from stresses experienced by the package. As a result, there is a need to solve the problems of the related art by providing a semiconductor device package with structural strength to prevent warpage and increased surface area for decoupling capacitors.

SUMMARY

Exemplary embodiments include methods, apparatuses, and systems directed to applying a thermoset plastic molding to cover capacitors in flip-chip packages with on-package decoupling. In particular exemplary embodiments, a method takes as an input a package substrate on which multiple capacitors have been mounted in a ring or outer periphery of the package substrate. The method involves plasma cleaning the package substrate and the capacitors, to remove organic contaminants. The method also involves applying a thermoset plastic to the capacitors and the surrounding package substrate, using a mold into which solid plastic is injected and heated. In particular exemplary embodiments, the plastic has a coefficient of thermal expansion which is relatively similar to the coefficient of thermal expansion of the package substrate. The method further involves opening the mold and curing the molded plastic until the thermoset compound becomes cross-linked. In particular exemplary embodiments, the curing is accomplished through exposure to an elevated temperature, e.g., baking.

In other exemplary embodiments, an apparatus includes a package substrate for use in flip-chip packaging of a semiconductor device and multiple capacitors mounted on a surface of the package substrate to provide on-package decoupling. A molding compound covers the capacitors and the package substrate surrounding the capacitors. In particular exemplary embodiments, the molding compound is made from a thermoset plastic which has a coefficient of thermal expansion which is relatively similar to the coefficient of thermal expansion of the package substrate. The molding compound is heated for a period of time following injection into a mold. Then the mold is opened and the thermoset plastic is cured at an elevated temperature until the thermoset plastic becomes completely cross-linked.

The advantages of the present invention will become apparent from the following detailed description, taken in conjunction with the accompanying drawings, illustrating by way of example the principles of the invention.

DETAILED DESCRIPTION

In the following description, numerous specific details are set forth in order to provide a thorough understanding of the exemplary embodiments. However, it will be apparent to one skilled in the art that the exemplary embodiments may be practiced without some of these specific details. In other instances, process operations and implementation details have not been described in detail, if already well known.

Figure 1:
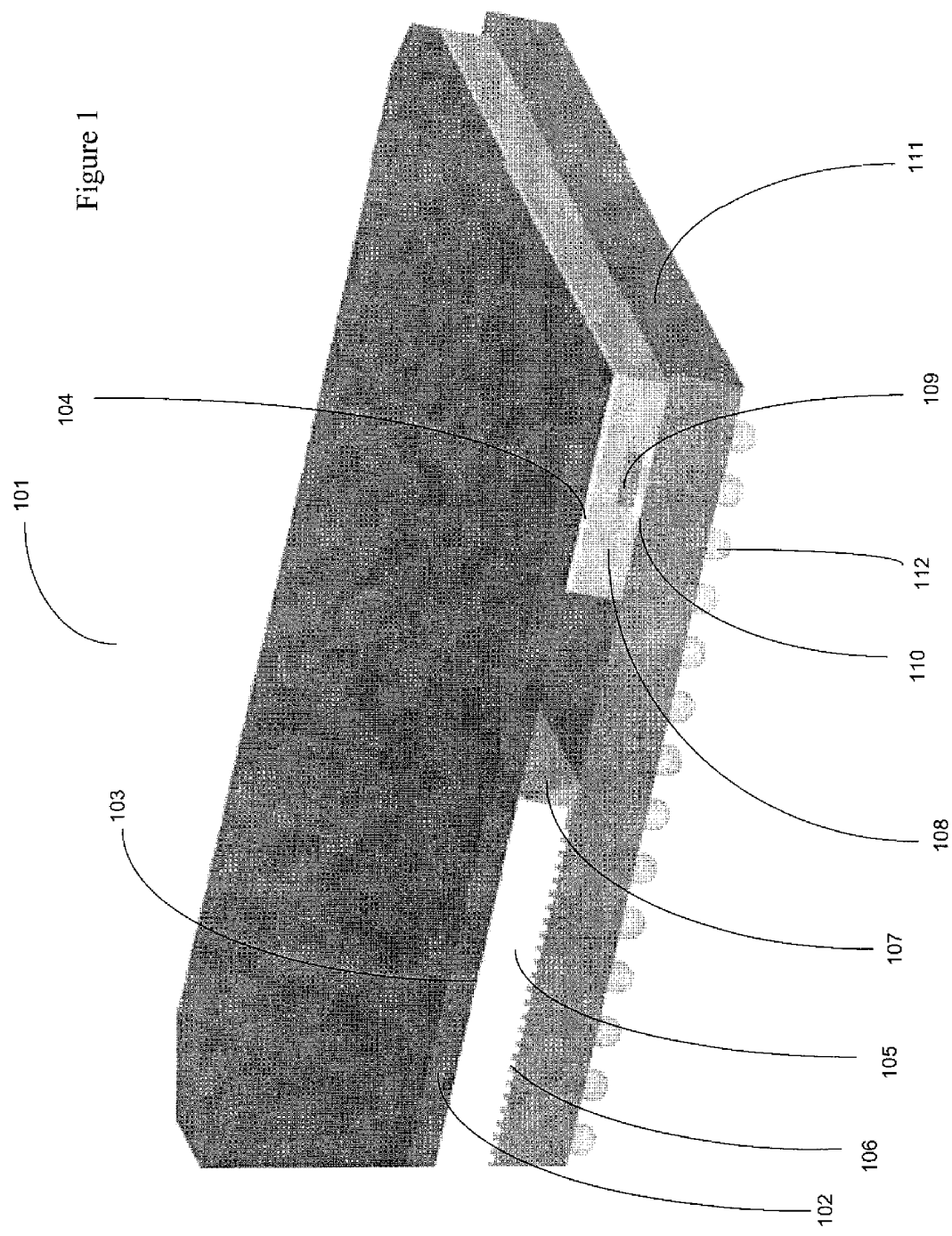
FIG. 1 is a simplified schematic diagram illustrating a sectional view of a flip-chip package with on-package decoupling and thermoset molding, in accordance with an exemplary embodiment.

FIG. 1 is a simplified schematic diagram illustrating a sectional view of a flip-chip package with on-package decoupling and molding, in accordance with an exemplary embodiment. It will be appreciated that the flip-chip package 101 includes many other components besides the chip (or die) 105, which sits atop of its solder bumps 106. Underfill 107 is provided to fill in the spaces between the solder bump 106 and chip 105.

In FIG. 1, the top layer of the flip-chip package 101 is heat sink 102. Beneath the heat sink 102 and above the chip 105, is a layer of thermal integrate material 103. Layer 103 is deposited over the chip 105 and does not extend all the way across the flip-chip package 101 similar to the heat sink. In this exemplary embodiment, thermal adhesive 104 is deposited over a top surface of thermoset molding 108, which in turn is formed over the capacitors 109. One skilled in the art will appreciate that thermal integrate material 103 is designed to dissipate heat generated from chip 105, while thermal adhesive 104 does not necessarily require these heat transfer properties. Beneath the solder bumps 106 and thermoset molding 108 is the package substrate 111. In this exemplary embodiment, solder 110 is located between the capacitors 109 and the package substrate 111. Package substrate 111 includes solder spheres 112 which provide electrical pathways when mated with contacts on a printed circuit board to which flip-chip package 101 might be mounted.

In particular exemplary embodiments, the molding compound might be made of a thermoset plastic with a coefficient of thermal expansion (CTE) that is relatively similar to that of the package substrate 111. Such a thermoset plastic might include commercially available semiconductor encapsulating epoxy resins, e.g., Nitto GE100-LFCS or Hitachi CEL 9750ZHF10AKL-LSA. Using similar CTEs minimizes thermally induced stress between the thermoset molding and the package substrate. In particular exemplary embodiments, the CTE for thermoset molding might be 11 ppm (parts-per-million) and the CTE for the package substrate might be approximately 16 ppm. As illustrated with reference to FIG. 1, the use of a thermoset molding provides the structural integrity for the package and can eliminate the need for a metal stiffener ring. Accordingly, the package substrate has additional space availability for capacitors 109, as the thermoset molding is malleable initially to be able to be formed around the capacitors, rather than limiting the space for the capacitors as with a metal stiffener ring. One skilled in the art will appreciate that the molding compounds utilized for semiconductor packaging operations are generally composite materials consisting of epoxy resins, phenolic hardeners, silicas, catalysts, pigments, and mold release agents.

One skilled in the art will further appreciate that multiple properties may be considered when selecting a molding compound. These properties include the compound's glass transition temperature (Tg), moisture absorption rate, flexural modulus/strength, coefficient of thermal expansion, thermal conductivity, and adhesion properties. There are many types of molding compounds commercially available in the semiconductor industry. General-purpose molding compounds with relatively high flexural strengths that can withstand relatively larger stresses experienced by the device may be used for large and thick packages. Low to ultra-low stress molding compounds are preferred for the encapsulation of thin packages. High-thermal conductivity molding compounds, on the other hand, are required to encapsulate high-power devices. Molding compounds used for surface mount devices may have a low moisture absorption rate, or a high flexural strength at board-mounting temperatures, or a combination of both in order to prevent popcorn cracking. Accordingly, proper molding compound selection will prevent problems associated with manufacturability, package stress, package cracking, and interfacial delaminations. The embodiments described herein are not to be construed as being limited to a particular molding compound.

Figure 2:
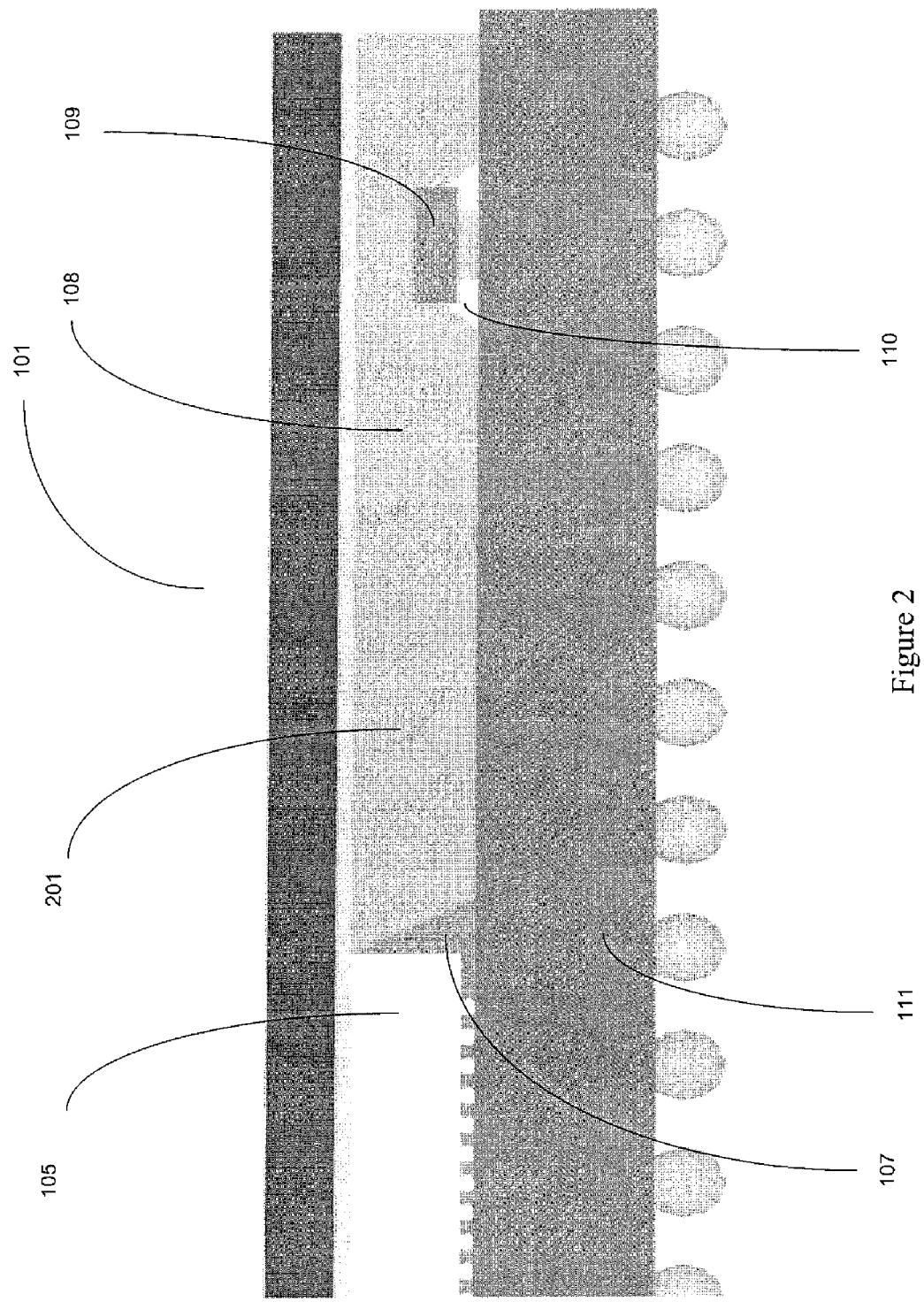
FIG. 2 is a simplified schematic diagram illustrating a cross-sectional view of a flip-chip package with on-package decoupling and thermoset molding, in accordance with an exemplary embodiment.

FIG. 2 is a simplified schematic diagram illustrating a cross-sectional view of a flip-chip package with on-package decoupling and a molding ring, in accordance with an exemplary embodiment. FIG. 2 illustrates the chip 105, the underfill 107, the thermoset molding 108, the capacitor 109, and the package substrate 111 depicted in FIG. 1. Additionally, FIG. 2 shows the empty space or void 201 that remains between the underfill 107 and the thermoset molding 108. It will be appreciated from this diagram that the thermoset molding 108 helps to prevent the flip-chip package 101 from warping by providing structural support for the top layers, e.g., the heat sink, of the flip-chip package 110. Further, it will be appreciated that the thermoset molding 108 helps to protect the capacitor 109 and the solder 110 from corrosion and contamination by encapsulating the capacitor 109 and the solder 110. One skilled in the art will appreciate that the structural integrity afforded by the thermoset molding 108 upon curing offers a viable alternative to a metal stiffener ring. As FIG. 2 is a cross sectional view, thermoset molding 108 is a ring of cured molding compound defined on an outer periphery of a surface of package substrate 111.

Figure 3:
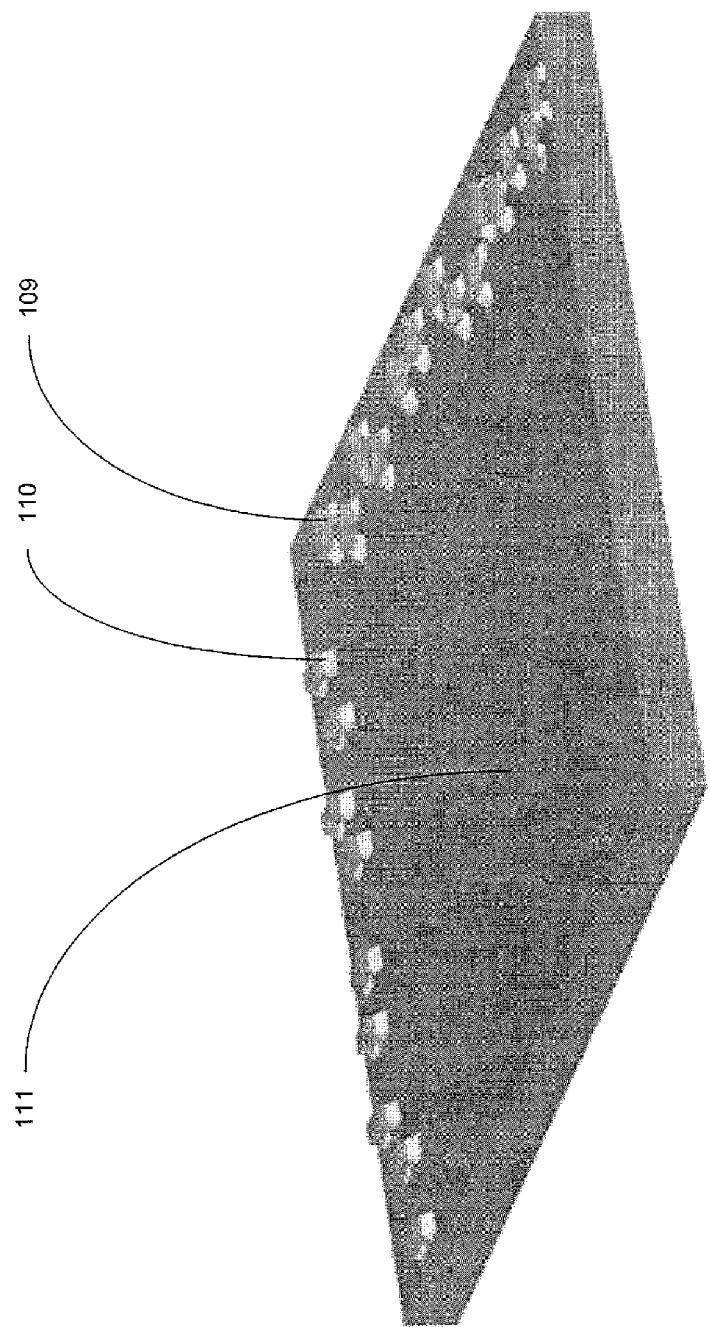
FIG. 3 is a simplified schematic diagram illustrating a package substrate onto which a ring of capacitors has been mounted, in accordance with an exemplary embodiment.

FIG. 3 is a simplified schematic diagram illustrating a package substrate onto which a ring of capacitors has been mounted, in accordance with an exemplary embodiment. It will be appreciated that FIG. 3 shows only one quadrant (i.e., the northeast quadrant) of a package substrate with four quadrants, as do FIGS. 4-6, for ease of illustration. FIG. 3 shows the capacitors 109 and solder 110 attached to the substrate 111, prior to application of the thermoset molding.

Figure 4:
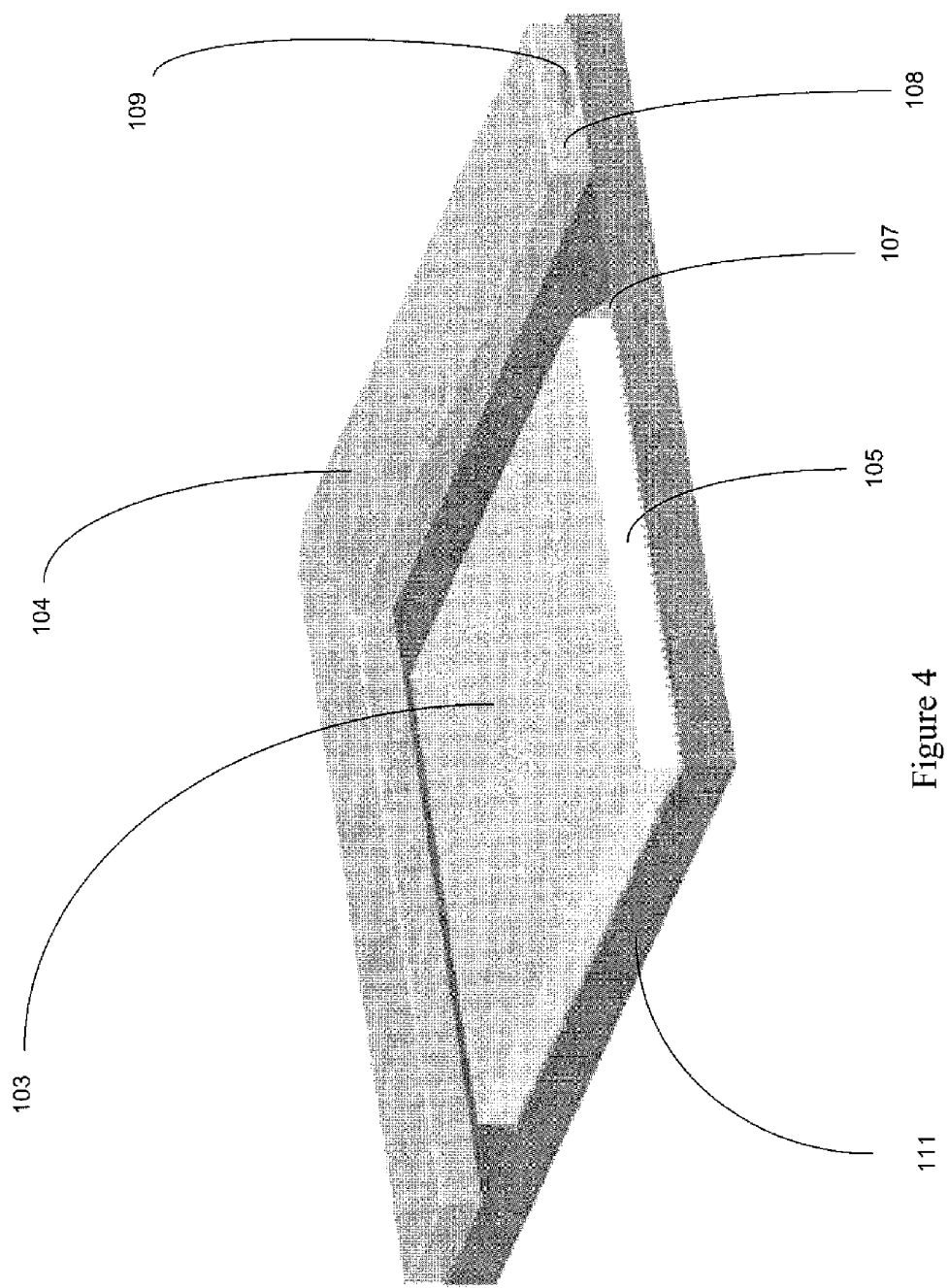
FIG. 4 is a simplified schematic diagram illustrating a chip mounted on a package substrate with thermoset molding, in accordance with an exemplary embodiment.

FIG. 4 is a simplified schematic diagram illustrating a chip mounted on a package substrate with thermoset molding, in accordance with an exemplary embodiment. FIG. 4 depicts the chip 105 on package substrate 111 with a top surface covered by a layer of thermal integrate material 103 and the thermoset molding 108 having a top surface covered by a layer of thermal adhesive 104. The thickness of the thermal integrate material 103 and the thermal adhesive 104 is approximately the same in one embodiment. FIG. 4 also depicts the capacitors 109 covered by the thermoset molding 108, which forms a three dimensional frame around the chip 105. It will be appreciated that the height of the chip 105 is equivalent to the height of the thermoset molding 108. Underfill 107 is shown extending slightly beyond the chip 105 on the package substrate 111. One skilled in the art will appreciate that conventional manufacturing processes for flip chip packages may be utilized with the embodiments described herein. Thermoset molding 108 may be deposited through an injection molding process in one embodiment.

Figure 5:
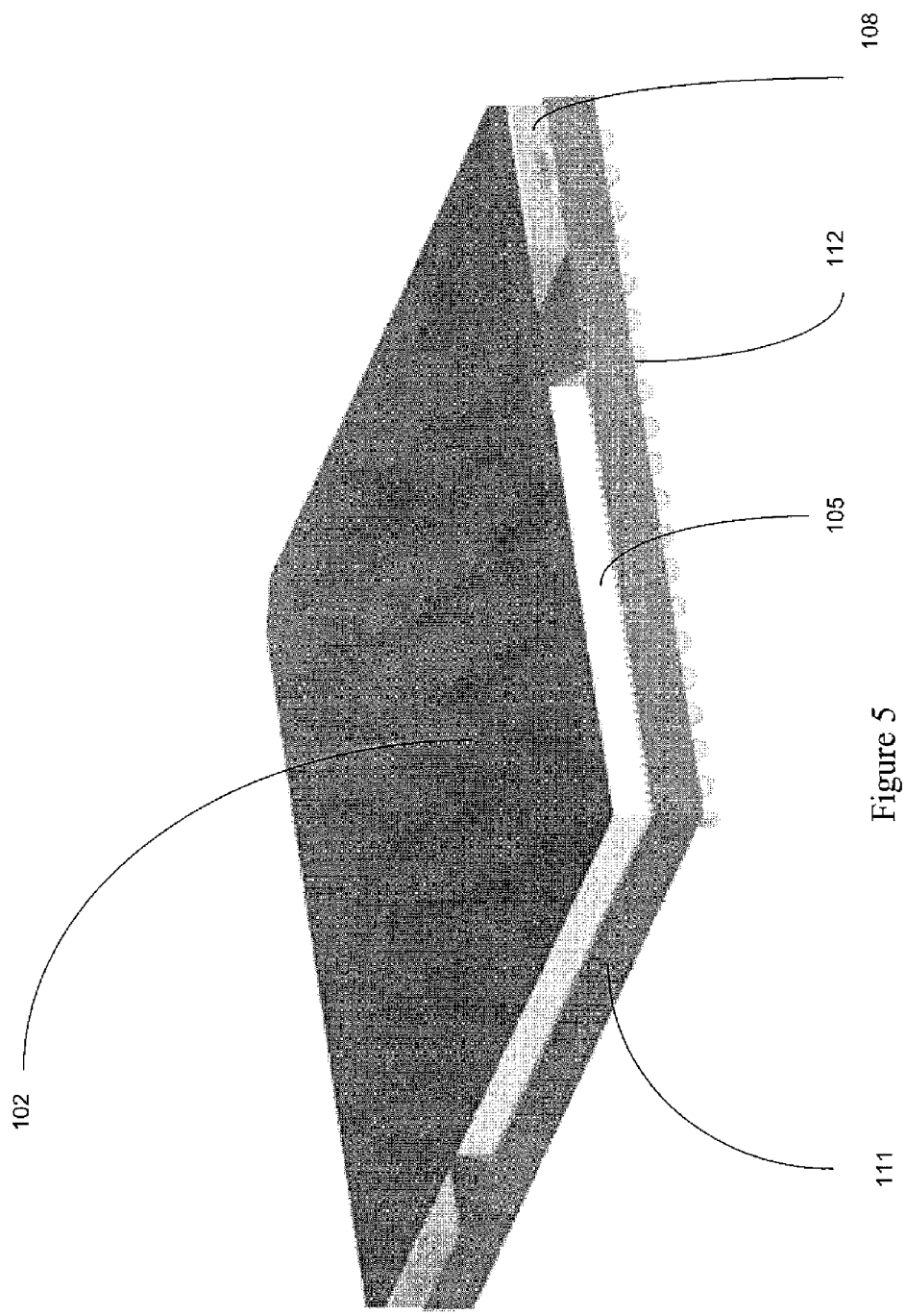
FIG. 5 is a simplified schematic diagram illustrating a heat sink attached to a chip and thermoset molding, and the solder spheres attached to a packaging substrate, in accordance with an exemplary embodiment.

FIG. 5 is a simplified schematic diagram illustrating a heat sink attached to a chip and thermoset molding, in accordance with an exemplary embodiment. In this figure, a heat sink 102 covers both the chip 105 and the thermoset molding 108, both of which are disposed on the package substrate 111. As shown in the figure, an empty space or void 201 exists between the chip 105 and the molding 108. The solder spheres 112 are attached to the bottom of the package substrate 111. Heat sink 102 functions to dissipate heat generated from chip 105. In one embodiment, heat sink 102 is composed of a conductive metal, such as copper.

Figure 6:
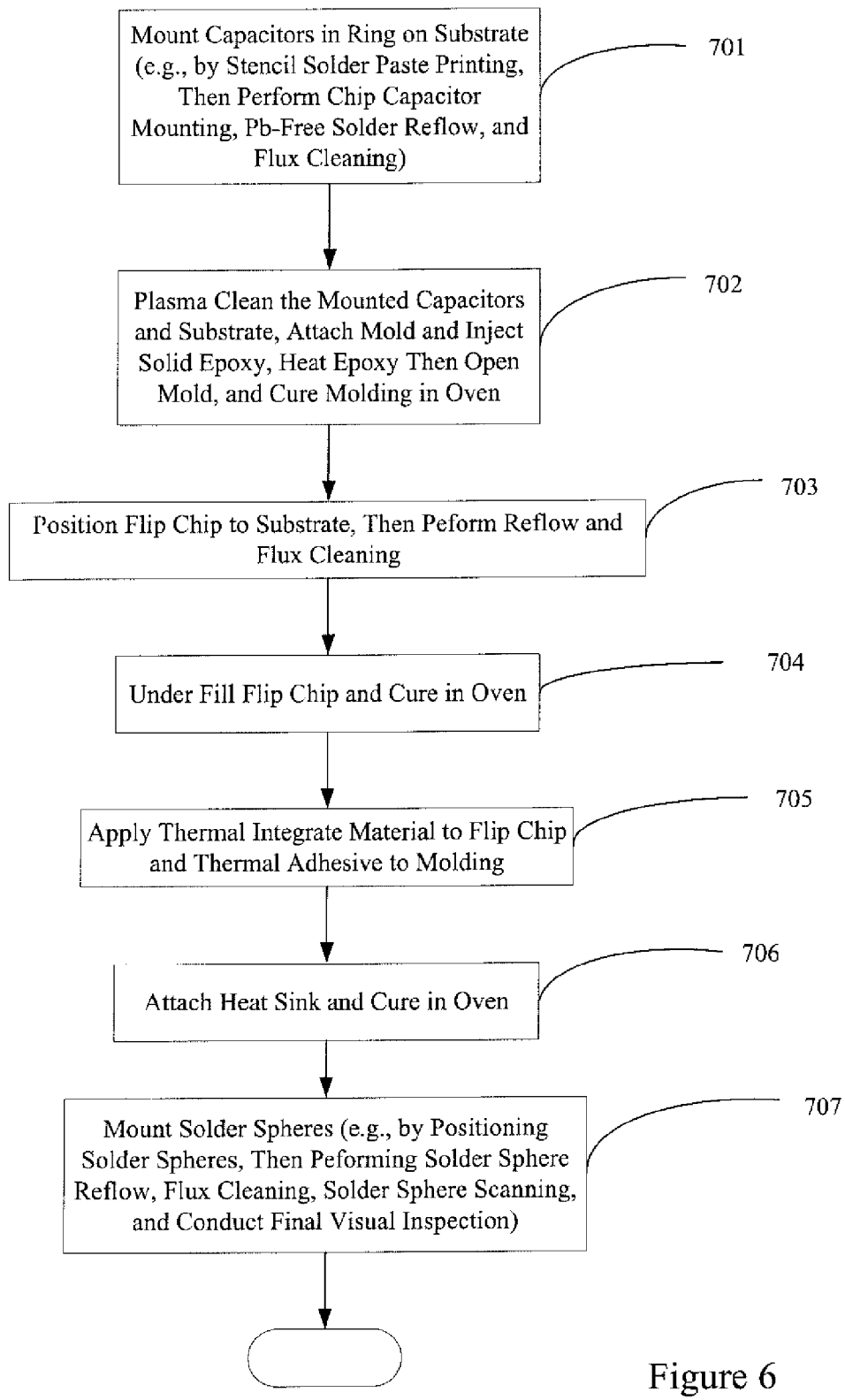
FIG. 6 is a simplified flowchart diagram illustrating a process for creating a flip-chip package with thermoset molding covering the capacitors mounted on the package substrate, in accordance with an exemplary embodiment.

FIG. 6 is a simplified flowchart diagram illustrating a process for creating a flip-chip package with a molding providing structural support and covering the capacitors mounted on the package's substrate, in accordance with an exemplary embodiment. Operation 701 of the process involves mounting capacitors in a ring on the substrate. One skilled in the art will appreciate that the mounting might be achieved by solder paste printing, chip capacitor mounting, Pb-free solder reflow, and flux cleaning. It will further be appreciated that the results of this operation are depicted with reference to FIG. 3. Operation 702 of the process involves plasma cleaning the mounted capacitors and package substrate, attaching and heating the metal mold and injecting solid epoxy thereon, heating the injected epoxy for a period of time, then opening the mold, and curing the molding by baking the exposed epoxy at an elevated temperature in an oven. In operation 703 of the process, the chip is positioned on the substrate (e.g., with the solder bumps resting on the substrate) and reflow and flux cleaning are performed. Operation 704 of the process involves underfilling the chip and curing the underfill. In one exemplary embodiment, the underfill is cured by baking the underfill for a period of time as is commonly known in the art.

Operation 705 involves applying thermal integrate material to a top surface of the chip and thermal adhesive to a top surface of the molding. Operation 706 involves placing a heat sink over the thermal integrate material and the thermal adhesive and curing the thermal integrate material and the thermal adhesive so that the thermal integrate material and the thermal adhesive bond to the heat sink and corresponding chip and molding. It will be appreciated that the results of this operation are depicted in FIG. 5. Operation 707 involves mounting the solder spheres, e.g., by positioning the solder spheres, performing solder sphere reflow, reflux cleaning, and solder sphere scanning, and conducting a final visual inspection. It will be appreciated that the results of this operation are depicted in FIG. 6.

In particular exemplary embodiments, the plasma cleaning done in operation 702 makes use of argon gas. In alternative embodiments, other gases (e.g., oxygen) might be used for the plasma cleaning or other types of cleaning methods might be used. Also, in particular exemplary embodiments, the metal mold in which the molding compound is injected or placed in operation 702 may be hard chrome or some other similar metal. In one embodiment, the metal mold is heated to a temperature of about 175 degrees Celsius (e.g., with a resistive-heating element disposed within the metal mold) prior to the addition of the thermoset plastic, e.g., in the form of solid pellets.

It will be appreciated that thermoset plastics are polymer materials that irreversibly cure to a stronger structural form or state. The curing process may be accomplished through heat, through a chemical reaction, or irradiation, such as electron beam processing or ultraviolet irradiation. Thermoset plastics are usually liquid or malleable prior to curing and designed to be molded into their final form. The curing process transforms the polymer materials into a plastic by cross-linking the polymer. More specifically, energy and/or catalysts are added that cause polymer chains to react at chemically active sites (unsaturated or epoxy sites, for example), linking into a rigid, 3-D structure. In one embodiment, the cross-linking process forms a molecule with a larger molecular weight, resulting in a material with a higher melting point.

In particular exemplary embodiments, the thermoset plastic is kept at a temperature of about 175 degrees Celsius for 120 seconds, after the thermoset plastic is added to the hot mold in operation 702. It should be noted that the mold may be preheated or the mold may be enabled with a heating mechanism, e.g., resistive heating elements to maintain the desired temperature. The mold is then opened and the thermoset plastic is cured for five hours in an oven whose temperature is also about 175 degrees Celsius, in order to completely cross-link the thermoset plastic. The chip or die incorporated into the package may be any suitable integrated circuit, including microprocessors and programmable logic devices.

Although the foregoing exemplary embodiments have been described in some detail for purposes of clarity of understanding, it will be apparent that certain changes and modifications may be practiced within the scope of the appended claims. For example, the order of the operations in the process depicted in FIG. 7 might be altered. Accordingly, the exemplary embodiments are to be considered as illustrative and not restrictive, and the invention is not to be limited to the details given herein, but may be modified within the scope and equivalents of the appended claims.

What is claimed is:

1. A method, comprising:
    plasma cleaning a package substrate to which a plurality of capacitors have been mounted in a ring formation around a peripheral surface of the package substrate to provide on-package decoupling for a semiconductor device package;
    applying a molding compound to the peripheral surface of the package substrate surrounding the capacitors, wherein the molding compound is guided by a mold;
    heating the molding compound in the mold;
    opening the mold to expose the heated molding compound;
    curing the exposed molding compound for a period of time, wherein the mold is opened prior to the curing, and wherein the cured molding compound comprises a ring of cured molding compound surrounding the capacitors around the peripheral surface of the package substrate;
    placing an integrated circuit onto a top surface of the package substrate within an area defined by the ring formation, the placing occurring after the applying and the heating, the integrated circuit placed within an opening defined within interior sidewalls of the cured molding compound, and wherein a gap exists between sides of the integrated circuit and the ring of cured molding compound; and
    applying a layer of thermal integrate material to a surface of the integrated circuit.

2. The method of claim 1, wherein a coefficient of thermal expansion for the package substrate is within about 5 parts per million of a coefficient of thermal expansion for the molding compound, and wherein the package substrate comprises a plurality of pairs of alternating layers of an insulator and a conductor.

3. The method of claim 1, wherein the mold is heated prior to applying the molding compound.

4. The method of claim 1, wherein the molding compound is a semiconductor epoxy resin.

5. The method of claim 1, wherein the molding compound is a thermoset plastic.

6. The method of claim 1, wherein the curing operation includes exposing the package substrate to an elevated temperature.

7. The method of claim 6, wherein the elevated temperature is about 175 degrees Celsius and the period of time is about five hours.

8. The method of claim 5 wherein the thermoset plastic is heated at a temperature of approximately 175 degrees Celsius in the mold for a period of approximately 120 seconds after the molding compound is placed into the mold.

9. The method of claim 1, wherein the plasma cleaning includes striking an argon based plasma.

10. The method of claim 1, wherein the mold encompasses an outer peripheral region of the package substrate and wherein the integrated circuit is spaced apart from the cured molding compound.

11. The method of claim 1 further comprising;
    flowing underfill between a bottom surface of the integrated circuit and the top surface of the package substrate, wherein side edges of the integrated circuit and an outer periphery of the underfill are spaced apart from the interior sidewalls of the molding compound.

12. An integrated circuit prepared by a process comprising:
    plasma cleaning a package substrate to which a plurality of capacitors have been mounted in a ring formation around a peripheral surface of the package substrate to provide on-package decoupling for a semiconductor device package;
    applying a molding compound to the peripheral surface of the package substrate surrounding the capacitors, wherein the molding compound is guided by a mold;
    heating the molding compound in the mold;
    opening the mold to expose the heated molding compound;
    curing the exposed molding compound for a period of time, wherein the mold is opened prior to the curing, and wherein the cured molding compound comprises a ring of cured molding compound surrounding the capacitors around the peripheral surface of the package substrate;

placing an integrated circuit onto a top surface of the package substrate within an area defined by the ring formation, the placing occurring after the applying and the heating, the integrated circuit placed within an opening defined within interior sidewalls of the cured molding compound, and wherein a gap exists between sides of the integrated circuit and the ring of cured molding compound; and applying a layer of thermal integrate material to a surface of the integrated circuit.

13. The integrated circuit of claim 12, further comprising: heating the mold prior to applying the molding compound.

14. The integrated circuit of claim 12, wherein the mold encompasses an outer peripheral region of the package substrate, wherein the package substrate comprises a plurality of pairs of alternating layers of an insulator and a conductor and wherein the integrated circuit is spaced apart from the cured molding compound.

15. The integrated circuit of claim 12, wherein the molding compound is a thermoset plastic that is heated at a temperature of approximately 175 degrees Celsius in the mold for a period of approximately 120 seconds after the molding compound is placed into the mold.

16. The integrated circuit of claim 12, further comprising;

flowing underfill between a bottom surface of the integrated circuit and the top surface of the package substrate, wherein side edges of the integrated circuit and an outer periphery of the underfill are spaced apart from the interior sidewalls of the molding compound.

17. A method, comprising:

mounting a plurality of capacitors in a ring formation to a peripheral region of a top surface of a package substrate to provide on-package decoupling for a semiconductor device package, the package substrate comprising a plurality of alternating layers of an insulator and a conductor;

applying a molding compound to the peripheral region of the top surface of the package substrate, the molding compound surrounding the capacitors;

heating the molding compound;

opening a mold encompassing the molding compound to expose the heated molding compound;

curing the exposed molding compound for a period of time, wherein the mold is opened prior to the curing, and wherein the cured molding compound comprises a ring of cured molding compound surrounding the capacitors around the peripheral region of the package substrate;

placing an integrated circuit onto a top surface of the package substrate within an area defined by the ring formation, the placing occurring at least after the applying and the heating, the integrated circuit placed within an opening defined within interior sidewalls of the cured molding compound, and wherein a gap exists between sides of the integrated circuit and the ring of cured molding compound;

applying a layer of thermal integrate material to a surface of the integrated circuit;

applying a layer of thermal adhesive to a surface of the cured molding compound; and placing a heatsink over the thermal integrate material and the thermal adhesive.

18. The method of claim 17, wherein the molding compound is a semiconductor epoxy resin.

19. The method of claim 17, wherein the molding compound is a thermoset plastic.

20. The method of claim 17, wherein the curing operation includes exposing the package substrate to an elevated temperature.

21. The method of claim 20, wherein the elevated temperature is about 175 degrees Celsius and the period of time is about five hours.

\* \* \* \* \*